United States Patent [19]

Takata et al.

[11] Patent Number: 4,960,649

[45] Date of Patent: Oct. 2, 1990

[54] REINFORCING METAL FIBERS

[75] Inventors: Susumu Takata; Mamoru Murahashi, both of Kobe, Japan

[73] Assignee: Kabushiki Kaisha Kobe Seiko Sho, Kobe, Japan

[21] Appl. No.: 471,062

[22] Filed: Jan. 29, 1990

Related U.S. Application Data

[63] Continuation of Ser. No. 126,760, Nov. 30, 1987, abandoned.

[51] Int. Cl.$^5$ .............................................. C04B 14/48
[52] U.S. Cl. ..................................... 428/574; 428/573; 106/644
[58] Field of Search ............... 428/573, 606, 574, 600, 428/577, 582, 605; 106/99

[56] References Cited

U.S. PATENT DOCUMENTS

| | | | |
|---|---|---|---|
| 1,635,222 | 7/1927 | Plaut | 428/574 |
| 2,780,860 | 2/1957 | Brickman | 428/573 |
| 3,214,877 | 11/1965 | Akin | 428/574 |
| 3,592,727 | 7/1971 | Weaver et al. | 428/600 |
| 3,728,211 | 4/1973 | Ball et al. | 106/99 |
| 3,953,953 | 5/1976 | Marsden | 428/603 |
| 4,559,276 | 12/1985 | Tezuka | 428/600 |
| 4,560,622 | 12/1985 | Tezuka et al. | 428/600 |

FOREIGN PATENT DOCUMENTS 60-221224  11/1985  Japan .

*Primary Examiner*—John J. Zimmerman
*Attorney, Agent, or Firm*—Oblon, Spivak, McClelland, Maier & Neustadt

[57] ABSTRACT

A concrete reinforcing metal fiber capable of being easily and uniformly dispersed in concrete. The metal fiber integrally includes a longitudinal strength body which bears tensile force that works thereon, and two rows of intermittent fins extending on the opposite sides of the strength body. The flatness ratio, namely, the ratio of the maximum width of the metal fiber to the maximum thickness of the same, of the metal fiber is in the range of 2.5 to 6.

3 Claims, 5 Drawing Sheets

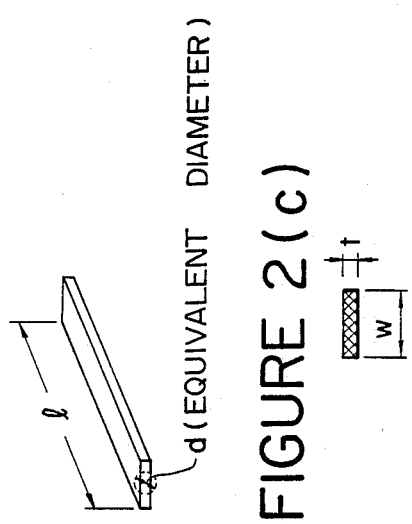
FIGURE 2(b)
FIGURE 2(c)
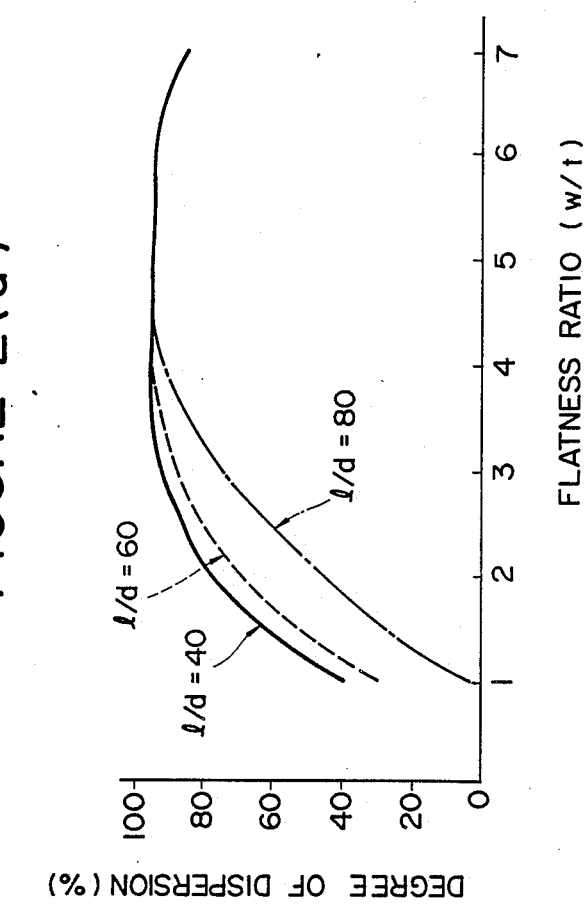
FIGURE 2(a)

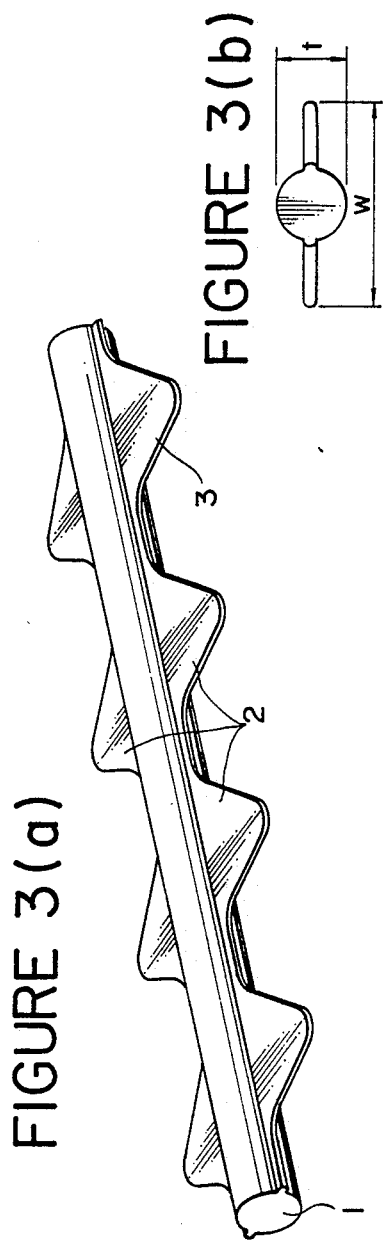
FIGURE 3(a)
FIGURE 3(b)
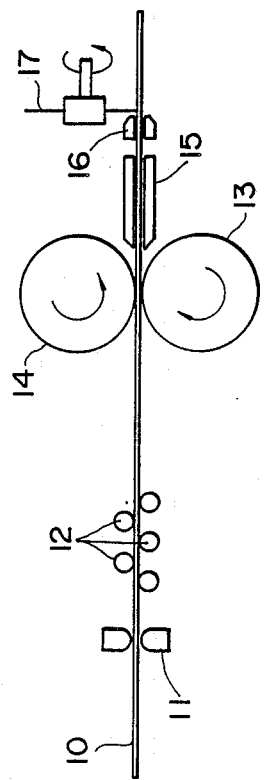
FIGURE 4

REINFORCING METAL FIBERS

This application is a continuation of application Ser. No. 07/126,760, filed on Nov. 30, 1987, now abandoned.

BACKGROUND OF THE INVENTION

1. Field of the Invention:

The present invention relates to reinforcing metal fibers, such as steel fibers, to be mixed in concrete or a refractory material to improve the physical properties of concrete or a refractory material.

2. Description of the Prior Art:

It has been common practice to mix metal fibers in concrete at a metal fiber content of 1 to 2% by volume in order to improve the strength and toughness of concrete structures. In most cases, such metal fibers are made of steel because of its low cost and high strength. Japanese Patent Provisional Publication (Kokai) No. 60-221224 discloses exemplary recent art relating to the present invention.

If a large quantity of metal fibers are supplied into concrete in a short time to save time for preparing fiber reinforced concrete, the metal fibers are liable to be entangled with each other resulting in the formation of fiber balls, and thereby the metal fibers are dispersed irregularly in the concrete Such irregular dispersion of the metal fibers in the concrete is unable to provide sufficient concrete reinforcing effect, and hence the fiber reinforced concrete has insufficient strength and toughness, and the required improvement of the physical properties can not be achieved, which is obvious from the bending load-deflection characteristic curve C in FIG. 1.

Such a problem can tentatively be solved by the use of a fiber dispersing machine, which is as heavy as over 100 kg, at the concrete mixing site during concrete mixing operations. However, the dispersing machine requires additional space for installation, additional maintenance work, and furthermore deteriorates working efficiency in mixing concrete.

It has been known that metal fibers whose tensile strength and bonding strength with concrete are well balanced can produce the most efficient concrete reinforcing effects. Efforts have been made to improve the concrete reinforcing characteristics of metal fibers through examinations on the influence of the aspect ratio on them. The aspect ratio is defined as l/d, where l is the length of a metal fiber and d is its equivalent diameter.

Basically, the section of the conventional metal fiber is round or square because of the availability of materials. To enhance the bonding strength of a metal fiber without changing the length thereof, it has been common practice to corrugate or indent the metal fiber along its entire length. However, the dispersibility of the metal fiber has not yet been improved satisfactorily and hence the dispersing machine has been used.

SUMMARY OF THE INVENTION

Accordingly, it is a principal object of the present invention to provide metal fibers capable of being uniformly dispersed without using a dispersing machine and capable of providing excellent concrete reinforcing effects.

The object of the invention is achieved by metal fibers to be mixed uniformly in concrete or the like as a reinforcement, each having a longitudinal strength body, and rows of fins integrally formed on the opposite sides of the longitudinal strength body with a flatness ratio in the range of 2.5 to 6. The flatness ratio is defined as w/t, where w is the distance between the respective extremities of the opposite fins and t is the thickness of the longitudinal strength body.

The metal fibers according to the present invention have the following effects.

(1) The metal fibers can be dispersed uniformly in concrete without using any dispersing machine which is used for preventing the formation of fiber balls.

(2) The excellent dispersibility of the metal fibers enables a smaller quantity of metal fibers to provide a necessary reinforcing effect, as compared with conventional metal fibers.

(3) The metal fibers have excellent concrete reinforcing effects.

(4) The metal fibers improve the efficiency of concrete mixing work and thus reduce the cost of concrete depositing work.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2(a) is a graph showing the variation of dispersibility as a function of the flatness ratio of metal fibers;

FIG. 2(b) is a perspective view showing the dimensions of tested metal fibers;

FIG. 2(c) is a sectional view showing the size of the section of tested metal fibers;

FIGS. 3(a) and 3(b) are a perspective view and an end view, respectively, of a metal fiber, in a first embodiment, according to the present invention;

FIG. 4 is a schematic arrangement of metal fiber manufacturing equipment;

DESCRIPTION OF THE PREFERRED EMBODIMENTS

It has been found through the study of the dependence of the dispersibility of metal fibers on the sectional shape of the same that an appropriate flatness ratio improves the dispersibility of metal fibers remarkably.

Metal fibers having different flatness ratios w/t, different lengths l, different widths w, a fixed thickness t and different aspect ratios l/d = 40, 60 and 80 (FIGS. 2(b) and 2(c)) were manufactured and were subjected to washing tests to estimate the dispersibility. As is obvious from FIG. 2(a), the dispersibility increases with the decrease of the aspect ratio l/d. The metal fibers having the flatness ratio w/t in the range of 2.5 to 6 have high dispersibility regardless of the aspect ratio. It is inferred from the test results that the metal fibers having a high flatness ratio are highly dispersible due to floating action. However, metal fibers having an excessively high flatness ratio are liable to be bent in concrete, which reduces the dispersibility and concrete reinforcing effects of the metal fibers.

FIGS. 3(a) and 3(b) illustrate one of the metal fibers, in a first embodiment according to the present invention, so made as to meet the reinforcing requirements and to have excellent dispersibility. This metal fiber consists of a longitudinal strength body 1, and rows of fins 2 intermittently projecting on the opposite sides of the strength body 1. The flatness ratio w/t (i.e. w is the maximum width and t is the maximum thickness as shown in FIG. 3(b)) of this metal fiber is in the range of 2.5 to 6. The longitudinal strength body 1 having a comparatively large sectional area bears tensile stress, and the surface 3 of the strength body 1 determines mainly the bonding strength of the metal fiber, and the edge surfaces of the fins 2 determine mainly the anchoring strength of the metal fiber.

Figure 1:
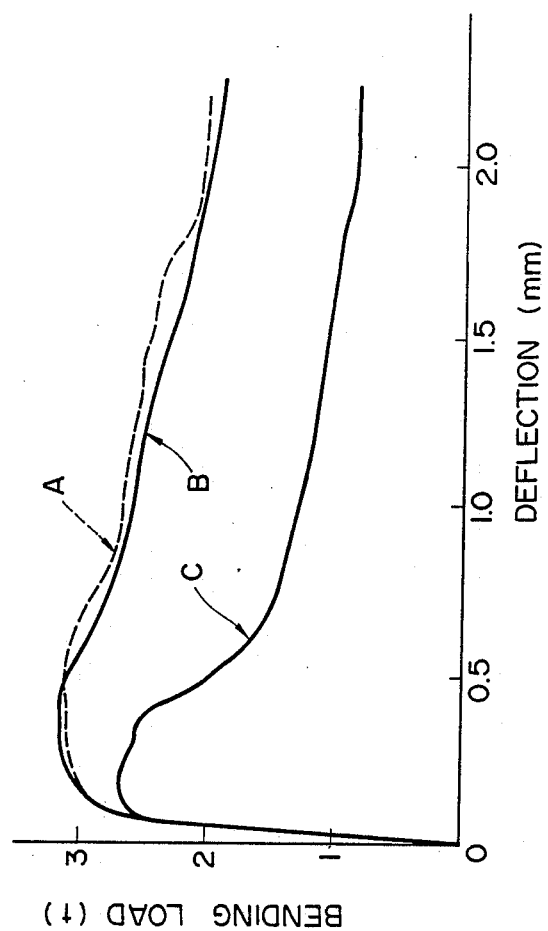
FIG. 1 is a graph comparatively showing bending characteristics of a concrete block specimen reinforced with the metal fibers of the present invention and those of concrete block specimens reinforced with conventional metal fibers.

In FIG. 1, bending load-deflection characteristic curve A represents the concrete reinforcing effects of the metal fibers as shown in FIGS. 3(a) and 3(b) when simply dispersed in concrete without using any dispersing machine, characteristic curve B represents the concrete reinforcing effects of conventional metal fibers dispersed uniformly in concrete by using a dispersing machine, and characteristic curve C represents the concrete reinforcing effects of the conventional metal fiber dispersed in concrete without using any dispersing machine and entangled in the form of fiber balls. It is obvious from FIG. 1 that the concrete reinforcing effect of the metal fiber of the present invention is equal to or somewhat higher than that of the conventional metal fiber dispersed in concrete by the dispersing machine, and is far higher than that of the conventional metal fiber dispersed in concrete without using any dispersing machine.

The manufacturing process for manufacturing metal fibers according to the present invention will be described hereinafter.

FIG. 4 illustrates a machine for manufacturing the metal fibers according to the present invention. The configuration of the equipment is substantially the same as that of the equipment disclosed in Japanese Pat. Provisional Publication No. 60-221224.

Referring to FIG. 4, guide dies 11 guide a drawn metal wire 10 having a round section to tension rollers 12. The tension rollers feed the wire under tension to a pair of forming rollers 13 and 14 for indenting. The indented metal wire is guided through cutter guides 15 to the fixed blade 16. Then a rotary cutter 17 cuts the indented metal wire into metal fibers having a predetermined length.

To produce a metal fiber as shown in FIG. 3(a), the forming rollers 13 and 14 are designed so as to form the strength body 1 by pressing the metal wire between the calibers of the two rollers and to form the fins 2 on the opposite sides of the metal wire 10 by expanding the metal wire 10 between the two rollers outside of the calibers.

Figure 5A:
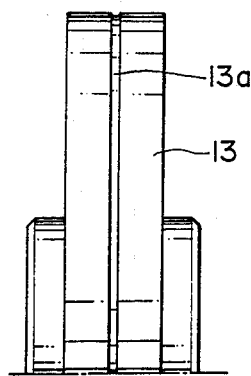
FIG. 5(a) is a half front elevational view of the first forming roller employed in the metal fiber manufacturing equipment of FIG. 4.
Figure 5B:
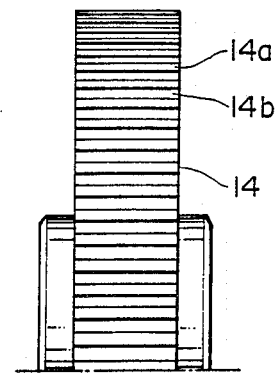
FIG. 5(b) is a half front elevational view of the second forming roller employed in the metal fiber manufacturing equipment of FIG. 4.
Figure 5C:
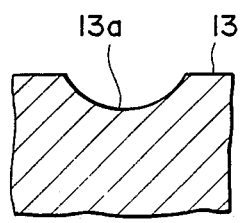
FIG. 5(c) is an enlarged fragmentary sectional view showing the groove of the first forming roller.
Figure 5D:
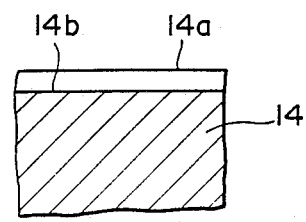
FIG. 5(d) is an enlarged fragmentary sectional view showing one of the teeth of the second forming roller.
Figure 6:
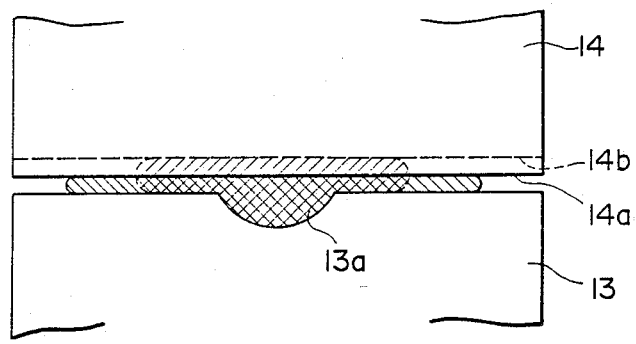
FIG. 6 is an enlarged fragmentary sectional view for assistance in explaining the mode of forming operation of the forming rollers.
Figure 7A:
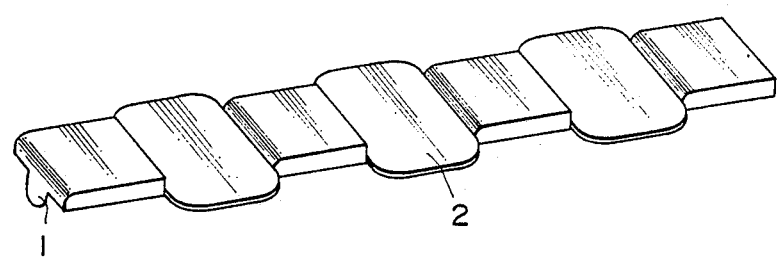
FIG. 7(a) is a perspective view of a metal fiber, in a second embodiment, according to the present invention.

FIG. 7(a) shows a metal fiber, in the second embodiment, according to the present invention. This metal fiber is formed by forming rollers 13 and 14 as illustrated in FIGS. 5(a) to 5(d). As shown in FIGS. 5(a) and 5(c), the forming roller 13 is provided with an semiannular groove 13a having a depth corresponding to one half to one fourth of the sectional diameter of the metal wire 10 mainly for forming strength body 1. The forming roller 14 is provided with ridges 14a extending in the direction of width of the forming roller 14 and furrows 14b extending between the ridges 14a. The ridges 14a and the furrows 14b are arranged along the circumference of the forming roller 14 at regular annular intervals. As shown in FIG. 6, the ridges 14a press the metal wire 10 heavily against the circumference of the forming roller 13 to form the fins 2. The furrows press the metal wire 10 moderately against the circumference of the forming roller 13 to form moderately expanded portions.

Figure 7B:
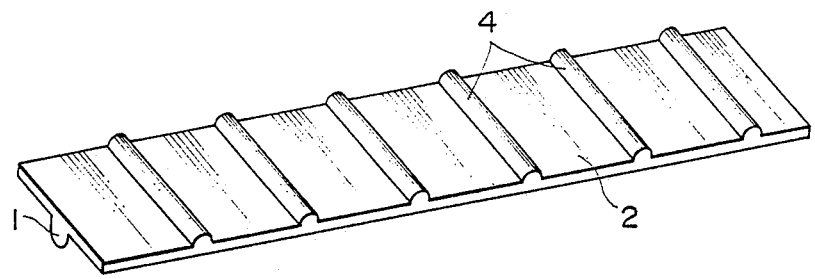
FIG. 7(b) is a perspective view of a metal fiber, in a third embodiment, according to the present invention.

The respective forms of the circumferences of the forming rollers 13 and 14 may optionally and selectively be designed to form a roll caliber corresponding to the desired form of the metal fiber. The metal fiber manufacturing equipment may be provided with a plurality of pairs of forming rollers to form the metal fiber through a plurality of forming stages. For example, ridges 4 as shown in FIG. 7(b) are formed in the first forming stage, and then the ridges 4 are rolled in the second forming stage to form fins. Ordinarily, the depth of the furrows 14b, namely, the difference in height between the ridges 14a and the furrows 14b, is in the range of 0.08 to 0.16 mm.

Furthermore, although the metal, fiber manufacturing process has been described based on an assumption that a single metal wire is processed at a time to facilitate understanding the process, forming rollers having a plurality of roll calibers may be employed to process a plurality of metal wires simultaneously with high productivity.

Although the invention has been described in its preferred forms with a certain degree of particularity, many changes and variations of the present invention are possible in the light of the above teachings. It is therefore to be understood that the invention may be practiced otherwise than as specifically described without departing from the scope and spirit thereof.

What is claimed is:

1. A metal fiber to be mixed in a refractory material, which comprises:
   a longitudinal strength body having at least a radially extending cross-sectional configuration so as to form at least one substantially annular surface portion in cross-section along the entire length of said body and so as to define the thickness dimension of said body;
   a plurality of fins extending laterally in a first and second row positioned on opposite sides, respectively, of said strength body so as to define the width dimension of said body, said fins extending continuously along the length of said body wherein the ratio of a maximum width of the metal fiber to a maximum thickness of the metal fiber is in the range of 2.5 to 6.

2. A metal fiber to be mixed in a refractory material, which comprises:
   a longitudinal strength body having at least a radially extending cross-sectional configuration so as to form at least one substantially semiannular surface portion in cross-section along the entire length of said body and so as to define the thickness dimension of said body;
   a plurality of flat fins spaced longitudinally along said strength body and respectively positioned between additional substantially planar members and extending to opposite sides, respectively, of said strength body so as to define the width dimension of said body wherein the ratio of a maximum width of the metal fiber to a maximum thickness of the metal fiber is in the range of 2.5 to 6.

3. A metal fiber to be mixed in a refractory material, which comprises:
   a longitudinal strength body having at least a radially extending cross-sectional configuration so as to form at least one substantially semiannular surface portion in cross-section along the entire length of said strength body and so as to define the thickness dimension of said body;
   a fin member extending the length of said strength body and laterally on opposite sides, respectively, of said strength body so as to define the width dimension of said strength body; and
   a plurality of spaced ridges formed on a surface portion of said find member and extending transverse to a longitudinal axis of said strength body wherein the ratio of a maximum width of the metal fiber to a maximum thickness of a metal fiber is in the range of 2.5 to 6.

* * * * *